United States Patent [19]
Rodman et al.

[11] Patent Number: 5,757,658
[45] Date of Patent: May 26, 1998

[54] PROCEDURE AND SYSTEM FOR PLACEMENT OPTIMIZATION OF CELLS WITHIN CIRCUIT BLOCKS BY OPTIMIZING PLACEMENT OF INPUT/OUTPUT PORTS WITHIN AN INTEGRATED CIRCUIT DESIGN

[75] Inventors: Paul K. Rodman; Marjorie S. Levine, both of Palo Alto, Calif.

[73] Assignee: Silicon Graphics, Inc., Mountain View, Calif.

[21] Appl. No.: 611,785

[22] Filed: Mar. 6, 1996

[51] Int. Cl.$^6$ ............................................ G06F 17/50
[52] U.S. Cl. ................................. 364/491; 364/490
[58] Field of Search ................................ 364/488, 489, 364/490, 491

[56] References Cited

U.S. PATENT DOCUMENTS

| | | | |
|---|---|---|---|
| 3,621,208 | 11/1971 | Isett et al. | 364/489 |
| 3,644,937 | 2/1972 | Isett | 364/489 |
| 3,702,004 | 10/1972 | Eskew et al. | 364/489 |
| 5,151,868 | 9/1992 | Nishiyama et al. | 364/490 |
| 5,544,088 | 8/1996 | Aubertine et al. | 364/489 |
| 5,548,525 | 8/1996 | Albee et al. | 364/489 |

*Primary Examiner*—Vincent N. Trans
*Attorney, Agent, or Firm*—Wagner, Murabito & Hao

[57] ABSTRACT

A system and procedure for placement optimization of input/output ports associated with edges of circuit blocks within an integrated circuit design. The integrated circuit design is composed of circuit blocks that communicate using inter-block signal wires coupled to input/output ports (IOPs) located along edges of circuit blocks. An arbitrary IOP placement is first received, e.g., from a global floorplanner, and indicates (1) the allowable edge placement domains for each IOP and can optionally include (2) an arbitrary IOP placement within these allowable edge domains. A cell placer (e.g., a quadratic based standard cell placer) receives the arbitrary IOP placement and, for each circuit block, places cells represented within internal netlists. The placer does not optimize the placement of the IOPs. For each IOP, the set of cells of the net that is coupled to the IOP is determined. Each IOP is then moved, within its allowable edge placement, to a position closest to the nearest cell that is within its associated net. The above sequence is then repeated a number of times (e.g., IOPs are moved and the placer is run again); upon each run the routability of the placement is estimated. After the above iterations, the present invention accepts the placement with the best estimated routability and this placement is then routed by a router. By taking into account the position of cells associated with an IOP, and displacing the IOP near these cells, the internal circuit is more efficiently placed which reduces the size of the circuit block up to 30 percent.

21 Claims, 9 Drawing Sheets

PROCEDURE AND SYSTEM FOR PLACEMENT OPTIMIZATION OF CELLS WITHIN CIRCUIT BLOCKS BY OPTIMIZING PLACEMENT OF INPUT/ OUTPUT PORTS WITHIN AN INTEGRATED CIRCUIT DESIGN

BACKGROUND OF THE INVENTION

1. Field Of The Invention

The present invention relates to the field of computer aided design tools used for designing integrated circuits. Specifically, the present invention relates to input/output port placement optimizations in conjunction with a computer implemented placer.

2. Related Art

Integrated circuits are designed using computer aided design (CAD) tools. The integrated circuit design process includes constructing the integrated circuit design out of simple circuits (e.g., "standard cells") that are connected together electrically using wire interconnects. The standard cells and connections between them are stored in well known databases called "netlists."

As part of the design process, the design information within a netlist is placed and routed by the CAD tool. The CAD tool utilizes placing and routing processes (also called placers and routers) that are typically software programs executed on the CAD tool. The placer determines the optimum location of each standard cell within the integrated circuit layout on the semiconductor surface. The placement location is optimized to reduce the distance between standard cells that are electrically connected to each other by wire interconnects (e.g., input/output lines). This is done to minimize semiconductor area consumed by the integrated circuit and is also done to minimize the lengths of wire interconnects to reduce net capacitance within the design. The router optimizes the routing of input/output lines between connected standard cells so that areas of the integrated circuit layout do not become overly congested by input/output lines.

An integrated circuit design is typically composed of several circuit blocks (FIG. 2) that are themselves composed of series of standard cells. The circuit blocks are connected to each other by nets. The nets are themselves coupled to input/output ports (IOPs) of the circuit blocks. According to the CAD tools, the IOPs are positioned along the edges of the circuit blocks.

Optimizing the placement of IOPs with respect to a circuit block is advantageous because the optimization reduces the size of the circuit block. A non-optimal placement of the IOPs can result in an excess of wire that adds area to the integrated circuit and increases product costs and may reduce clock rates (e.g., performance). However, optimizing the placement of the IOPs along the edge of a circuit block with respect to the internal circuitry of the circuit block posses a problem within CAD systems. Specifically, most CAD systems do not optimize the placement of IOPs with respect to the internals of the block at all. Other CAD systems that do optimize IOP placement require an extensive amount of processing time to complete.

One type of prior art placer is effective at placing the cells of the internal circuitry of an integrated circuit block, but this placer does not optimize the placement of the IOPs along the edges of the circuit block. Instead, this prior art placer is supplied a predefined IOP placement which is then not altered by the placer. The result is a circuit block that has a disadvantageous amount of routing area within its internal circuitry because the IOP placement was assigned without respect to the actual locations of the standard cells (the assignment was made before the internal circuitry was placed). The additional size is provided to accommodate extra wiring area used to properly connect the cells to their associated IOPs, which may be very distant from the cells. What is needed is a system that optimizes the placement of the IOPs with respect to the internal circuitry of a circuit block. The present invention provides this capability.

Another prior art placer (e.g., that performs simulated annealing) automatically optimizes the placement of the IOPs along the edges of the circuit blocks in an effort to minimize the length of the wire connections between the IOPs and the internal circuitry of the circuit block. In this prior art design, the locations of the IOPs can be adjusted along their respective edges during the placing process. However, the simulated annealing placer is not advantageous because it requires an extensive amount of processing time to complete and does not produce adequate placements for the internal circuitry due in part to this extended processing period. Also, the main objective of the simulated annealing placer is to minimize wire interconnect lengths which often creates signal routing problems within the overall design. What is needed is an efficient IOP placement optimization procedure that performs well for internal circuit block circuitry and that does not require an extensive amount of processing to complete and that does not create signal routing problems for the internal circuitry of the circuit block. The present invention provides this capability.

Accordingly, the present invention provides a novel system for effectively optimizing the placement of IOPs with respect to internal circuitry of a circuit block to reduce the size of the circuit block. The present invention provides a system that adjusts the IOP locations during the placement process. The present invention provides an effective IOP placement optimization procedure that does not require an extensive amount of processing time, yet optimizes circuit block netlists and IOP placements to effectively eliminate routing problems within the circuit blocks and also to effectively reduce the size of these circuit blocks. These and other advantageous of the present invention not specifically mentioned above will become clear within discussions of the present invention presented herein.

SUMMARY OF THE INVENTION

A computer implemented procedure and system are discussed for placement optimization of input/output ports associated with edges of circuit blocks within an integrated circuit design. Computer implemented placement and route procedures (e.g., "placers and routers") do not take into consideration the placement of input/output ports when optimizing the placement of cells within the integrated circuit design. The integrated circuit design is composed of several circuit blocks that communicate with each other using input/output lines coupled to input/output ports (IOPs) located along edges of circuit blocks.

Within the present invention, an arbitrary IOP placement is first received and can be generated from a global floor planner procedure (GFP) of a computer aided design tool. The arbitrary IOP placement indicates (1) the allowable edge placements for each IOP and (2) an arbitrary assignment of ports within their allowable edge placements. A computer implemented cell placer (e.g., a quadratic based standard cell placer) and computer implemented router receives the arbitrary IOP placement and, for each circuit block, places the cells which are represented within internal netlists and routes their interconnections. During placement and routing. the cells (e.g.. standard cells) are placed so that the distance between connected cells is minimized without creating routing obstructions. The placer used in the present invention does not optimize the placement of the IOPs.

After the placer executes. for each IOP. the present invention identifies the net that is coupled to the IOP and the cells within this net. The integrated circuit design is then modified by moving each IOP within its allowable edge placement to a position closest to the nearest cell on the net that is coupled to the IOP. The above sequence is then repeated a number of times (e.g.. IOPs are moved and the placer is run again); upon each run the routability of the placement is estimated. After the above iterations. the present invention accepts the placement with the best estimated routability and this placement is then routed by a router. By taking into account the position of cells that a given IOP is coupled to. and displacing each IOP near the closest cell. the present invention more efficiently places the internal circuitry of the circuit block reducing the size of unused area and wire interconnect area of the circuit block. In accordance with the present invention. circuit blocks can be reduced in size up to 30 percent.

Specifically. embodiments of the present invention include. a computer implemented method for placing cells within an integrated circuit design and comprising the steps of: (a) receiving a set of input/output port placement constraints including eligible edge placement domains individually associated with the input/output ports; (b) determining an arbitrary initial placement for each input/output port within its associated eligible edge placement domain provided the arbitrary placement is absent from the input/output port placement constraints; (c) placing the cells of each circuit block using a placer procedure that does not optimize input/output port placement; (d) optimizing placements of the input/output ports in accordance with an optimization rule by adjusting placements of the input/output ports within their eligible edge placement domains; (e) performing a routability estimate of the integrated circuit design based on results generated in step (d); (f) repeating steps (c)–(e) over n cycles; and (g) selecting a best routable optimized placement of the n cycles and routing the best routable optimized placement.

Embodiments of the present invention include the above and wherein the step (d) comprises the step of adjusting placements of each input/output port along its eligible edge placement domain to a placement position closest to a coupled cell that is nearest to the eligible edge placement domain of the each input/output port. Embodiments of the present invention include the above and wherein the step (d) comprises the further step of adjusting placement of each input/output port along its eligible edge placement domain to a placement position that relieves routing congestion. Embodiments also include a computer system implemented in accordance with the above.

DETAILED DESCRIPTION OF THE INVENTION

In the following detailed description of the present invention. numerous specific details are set forth in order to provide a thorough understanding of the present invention. However. it will be obvious to one skilled in the art that the present invention may be practiced without these specific details or with equivalents thereof. In other instances. well known methods. procedures. components. and circuits have not been described in detail as not to unnecessarily obscure aspects of the present invention.

NOTATION AND NOMENCLATURE

Some portions of the detailed descriptions which follow are presented in terms of procedures. logic blocks. processing. steps. and other symbolic representations of operations on data bits within a computer memory. These descriptions and representations are the means used by those skilled in the data processing arts to most effectively convey the substance of their work to others skilled in the art. A procedure. logic block. process. etc.. is generally conceived to be a self-consistent sequence of steps or instructions leading to a desired result. The steps require physical manipulations of physical quantities. Usually. though not necessarily. these quantities take the form of electrical or magnetic signals capable of being stored. transferred. combined. compared. and otherwise manipulated in a computer system. It has proven convenient at times. principally for reasons of common usage. to refer to these signals as bits. values. elements. symbols. characters. terms. numbers. or the like.

It should be borne in mind that all of the above and similar terms are to be associated with the appropriate physical quantities they represent and are merely convenient labels applied to these quantities. Unless specifically stated otherwise as apparent from the following discussions. it is appreciated that throughout the present invention. discussions utilizing terms such as "processing" or "computing" or "calculating" or "determining" or "displaying" or the like. refer to the action and processes of a computer system. or similar electronic computing device, that manipulates and transforms data represented as physical (electronic) quantities within the computer system's registers and memories into other data similarly represented as physical quantities within the computer system memories or registers or other such information storage, transmission or display devices.

CAD COMPUTER SYSTEM

The present invention includes a system and a computer implemented process, in conjunction with a placer, for effectively optimizing the placement of input/output ports (IOPs) located on the perimeter of a circuit block with respect to internal cells that are electrically coupled to the IOPs. The process of the present invention is implemented within a computer aided design (CAD) tool which includes a computer system such as exemplary computer system 112 shown in FIG. 1.

Figure 1:
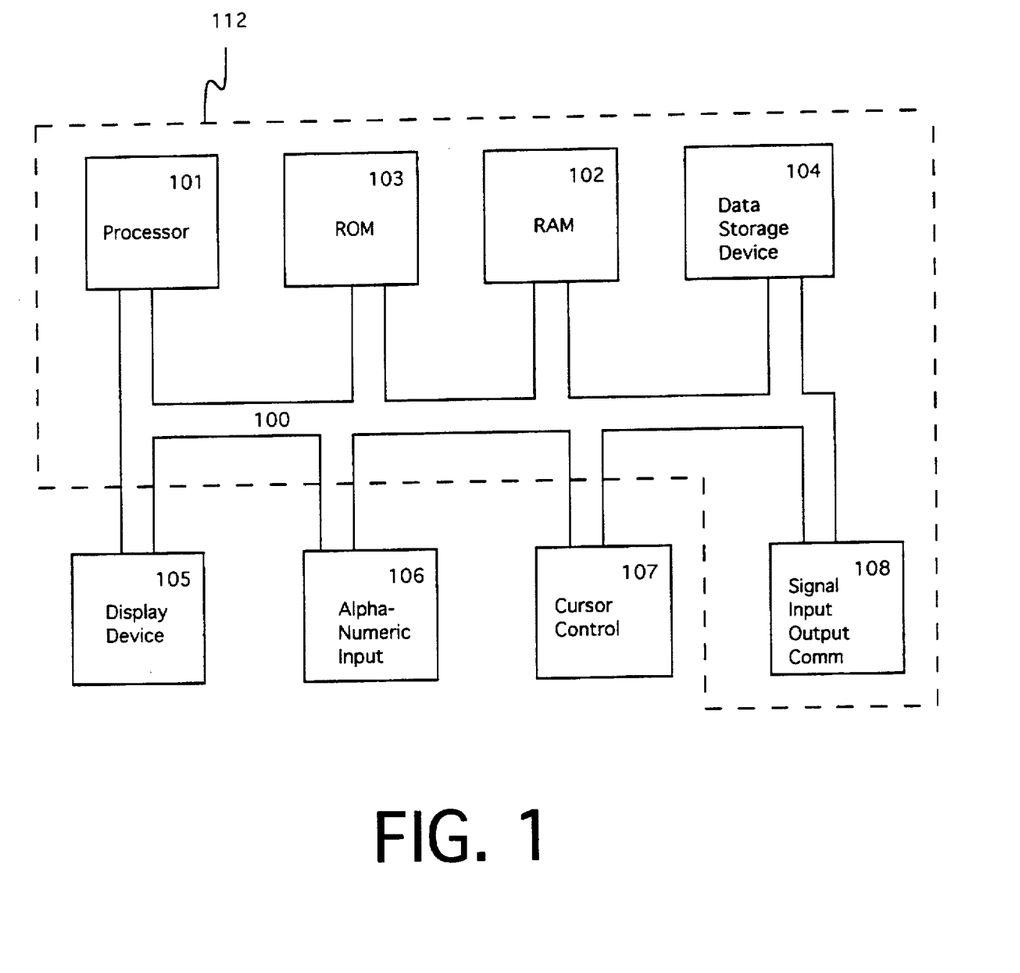
FIG. 1 is a block diagram of a general purpose computer system that can be used within a computer aided design (CAD) tool for designing. placing and routing integrated circuits in accordance with the present invention.

With reference to FIG. 1, the exemplary computer system 112 includes a bus 100 for communicating information, a central processor 101 coupled with the bus 100 for processing information and instructions and a volatile memory 102 (e.g., a random access memory) coupled with the bus 100 for storing information and instructions for the central processor 101. Computer system 112 also includes a nonvolatile memory 103 (e.g., a read only memory 103) which is coupled with the bus 100 for storing static information and instructions for the processor 101, a data storage device 104 such as a magnetic or optical disk and disk drive coupled with the bus 100 for storing information and instructions, and a display device 105 coupled to the bus 100 for displaying information to the computer user.

The display device 105 of FIG. 1 utilized with the computer system 112 can be a liquid crystal device, cathode ray tube, or other display device suitable for creating graphic images and alphanumeric characters recognizable to the user. Computer system 112 also includes an alphanumeric input device 106 including alphanumeric and function keys coupled to the bus 100 for communicating information and command selections to the central processor 101, a cursor control device 107 coupled to the bus for communicating user input information and command selections to the central processor 101, and a signal generating device 108 (e.g., a modem) coupled to the bus 100 for receiving and sending information to and from the processor 101.

CIRCUIT BLOCKS AND STANDARD CELLS

Figure 2:
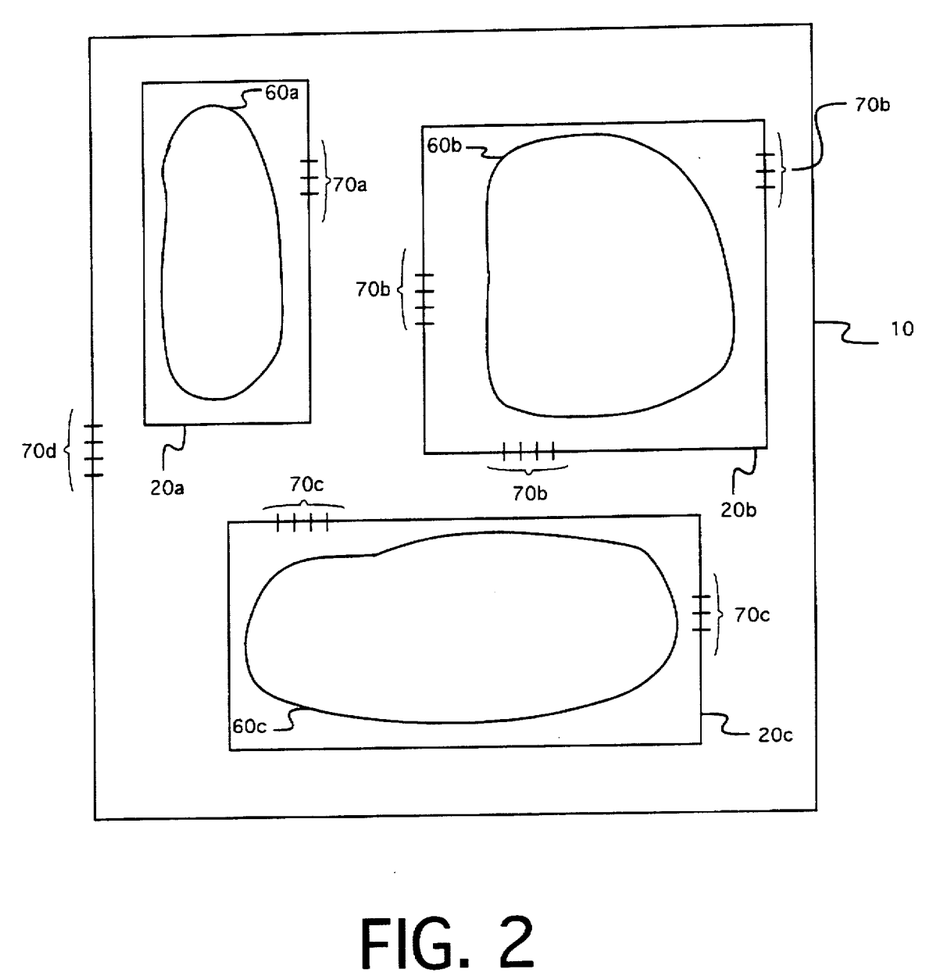
FIG. 2 is a block diagram illustration of an integrated circuit layout including several exemplary circuit blocks used by the present invention.

FIG. 2 illustrates an exemplary custom integrated circuit layout 10 including several custom circuit blocks 20a–20c. Each circuit block includes IOPs 70a–70c, located and modeled along the edges of the circuit block, as well as internal circuitry represented by netlists 60a–60c. Typically, more than one circuit block are used to represent an entire integrated circuit. The IOPs 70a–70c couple to interblock signal wires (not shown in FIG. 2) that allow the circuit blocks to communicate with each other. IOPs 70d are also located along the layout 10 and allow signals to be communicated from and to circuits located off-chip. These IOPs 70d are typically referred to as primary input and primary outputs.

Figure 3A:
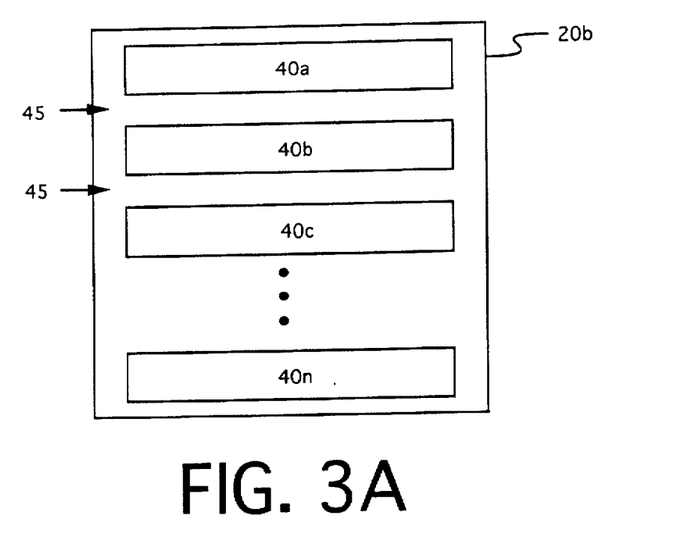
FIG. 3A is a block diagram illustration of an integrated circuit layout of a circuit block including several rows of standard cells used by the present invention.

With reference to FIG. 3A, an exemplary circuit block 20b is shown in more detail. The internal netlist 60b of custom circuit block 20b contains a number of rows 40a–40n of standard cell circuits. Each row 40a–40n can contain many standard cells. Routing channels 45 can be created between the rows 40a–40n and are used to allow flexible wire interconnect routing between the standard cells of the rows. A typical IOP of a circuit block can be coupled to one or more standard cells. A group of standard cells coupled to the same IOP are said to be part of a single net.

Figure 3B:
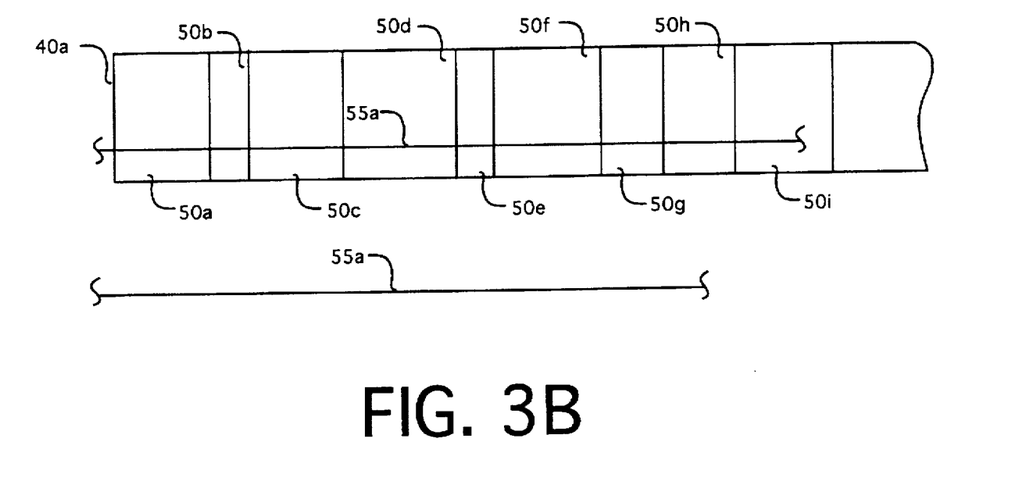
FIG. 3B illustrates an integrated circuit layout of an exemplary row of standard cells used by the present invention.

FIG. 3B illustrates an exemplary row 40a in more detail. As shown, row 40a is composed of several standard cell circuits 50a–50i. Each standard cell can have a variable width, as shown, but each standard cell shares the same height allowing uniform joining and packing. These geometry restrictions are employed to allow efficient placement of the standard cells during the placing process. As is well known in the art, each standard cell realizes a particular circuit function, e.g., flip-flop, AND gate, OR gate, XOR gate, multiplexer, etc., and the circuitry used to define a particular cell is stored in libraries within the computer system 112 of the CAD tool. Signal lines connecting standard cells can be placed inside the rows (e.g., line 55a) and/or outside the rows (e.g., line 55b).

During the placing process of the present invention, computer system 112 places the standard cells within rows in an attempt to minimize the distance between standard cells that are coupled together via input/output lines.

INPUT/OUTPUT PORTS OF A CIRCUIT BLOCK

Figure 4:
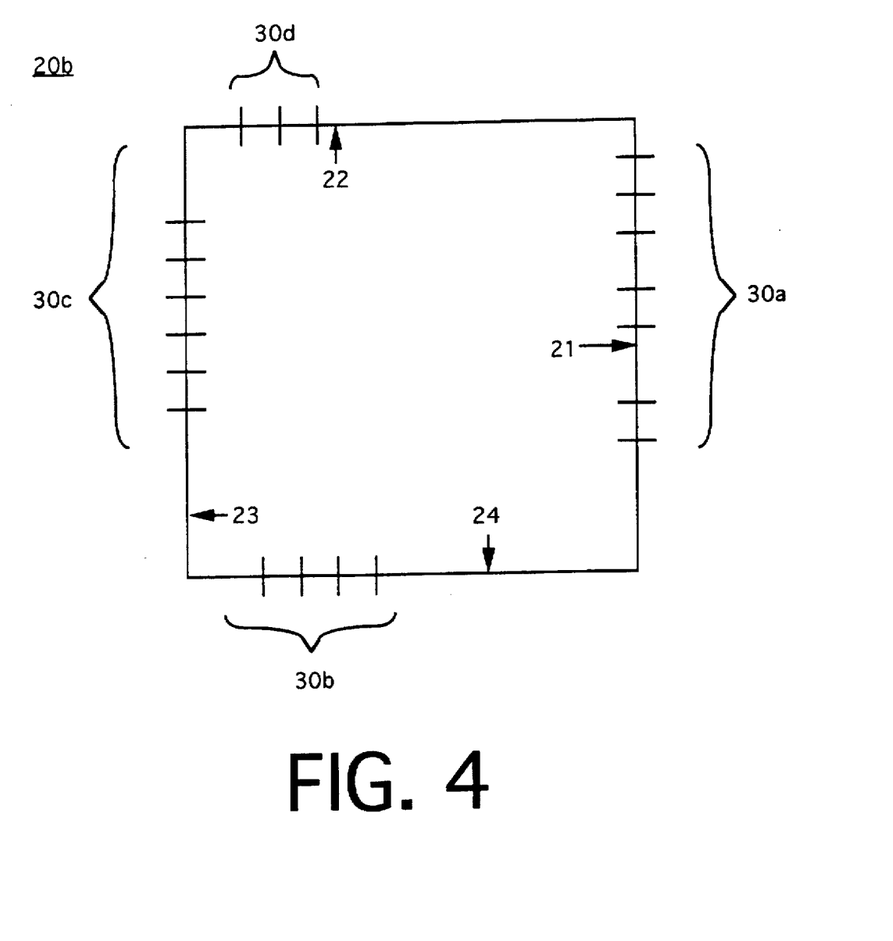
FIG. 4 is a block diagram illustrating input/output port assignments along edges of a circuit block in accordance with the present invention.

With reference to FIG. 4, an exemplary circuit block 20b is shown with its IOPs indicated in more detail along the edges of circuit block 20b. The placing process of the present invention models the IOPs as points along the edges of the circuit block 20b. Each IOP has an associated eligible edge placement domain indicates the edge, edges or portion of an edge on which it is eligible to be located. Not every edge need have IOPs and, as shown, the IOP distribution in number and in location need not be uniform across different edges of a circuit block. In the example of FIG. 4, edge 21 contains IOPs 30a, edge 24 contains IOPs 30b, edge 23 contains IOPs 30c, and edge 22 contains IOPs 30d. Although not shown, each IOP connects to an input/output wire connect to allow signals to be interchanged between other circuit blocks of the integrated circuit layout 10 (FIG. 2).

PREFERRED CELL PLACEMENT PROCESS OF THE PRESENT INVENTION

Figure 5A:
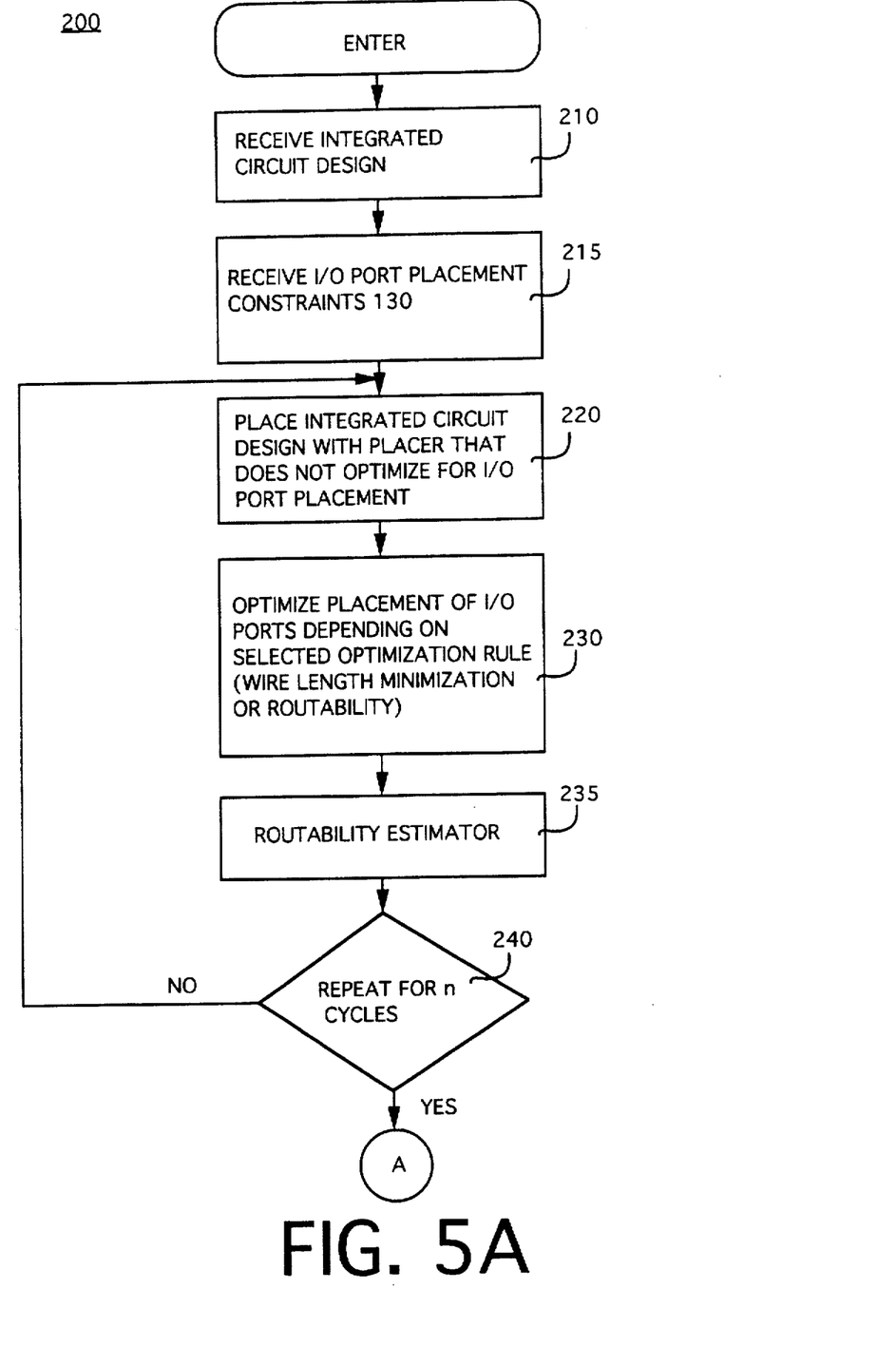
FIG. 5A is a first part of a flow diagram illustrating processing logic of one embodiment of the present invention.
Figure 5B:
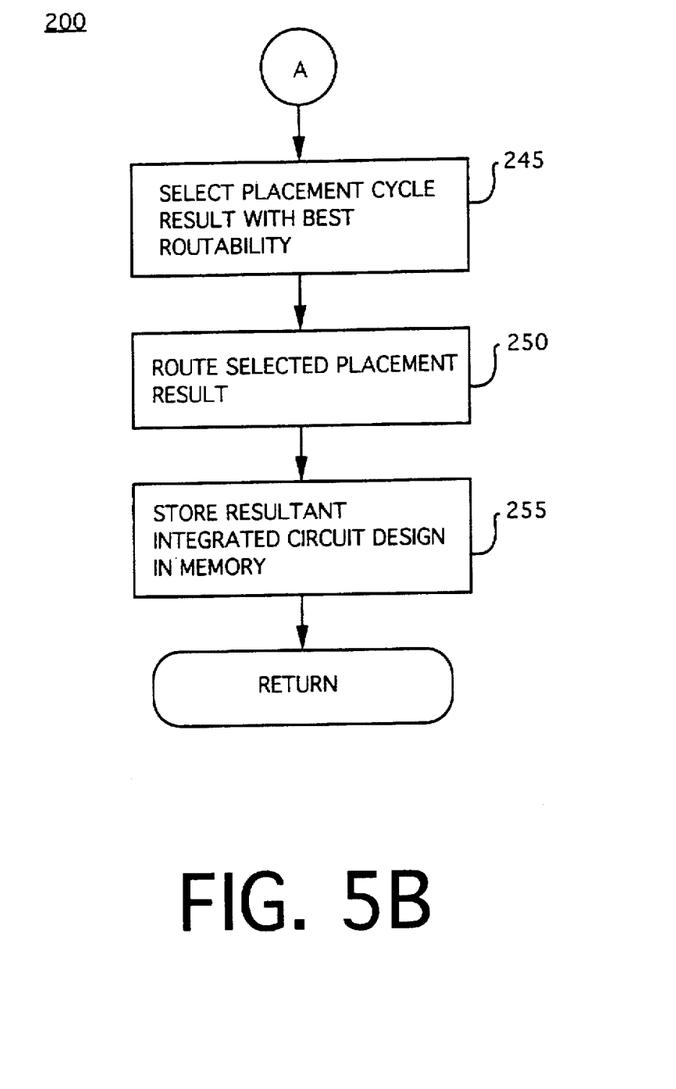
FIG. 5B is a second part of a flow diagram illustrating processing logic of one embodiment of the present invention.

FIG. 5A and FIG. 5B illustrate the placing process 200 of the present invention for optimizing IOP placements within an integrated circuit to provide reduced size circuit blocks. Process 200 is implemented within computer system 112 and includes several logic blocks which are executed by computer system 112. Program (e.g., instruction) code for implementing the process 200 is stored in memory unit 102 and is executed by processor 101 (FIG. 1).

Process 200 starts at logic block 210 where process 200 causes the computer system 112 to receive an integrated circuit design. In one embodiment, this integrated circuit design is represented as netlist. The integrated circuit design is stored in a memory unit (e.g., memory 102 or 104) of system 112. The integrated circuit design (FIG. 2) includes several circuit blocks (e.g., more than one) which communicate to each other over inter-block signal wires. Each inter-block signal wire is coupled to IOPs located along the perimeter of circuit blocks. Generally, two or more IOPs are coupled to each inter-block signal wire because an inter-block signal wire can be connected to two or more circuit blocks. Each circuit block also contains a netlist description which defines its internal circuitry.

Figure 6:
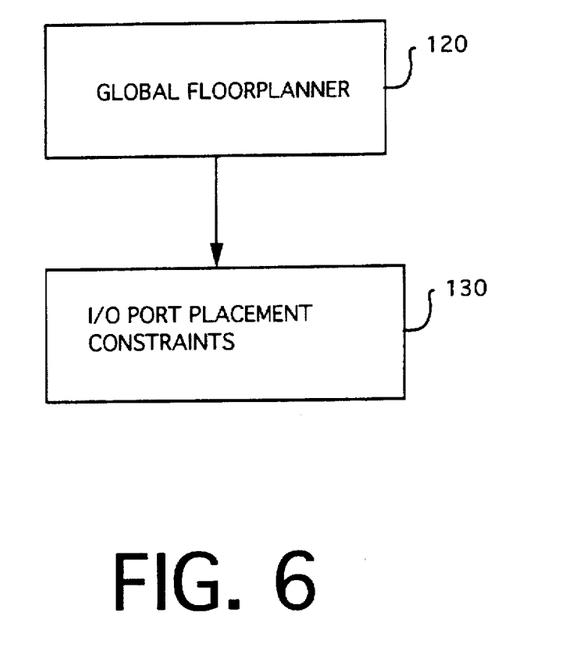
FIG. 6 is a flow diagramming illustrating an input/output port assignment data used by one embodiment of the present invention and generated by a global floorplanner.

At logic block 215 of FIG. 5A, the present invention causes the computer system 112 to receive a set of predetermined IOP placement constraints 130 (FIG. 6) pertinent to the integrated circuit design received at block 210. The IOP placement constraints 130 can originate from a computer memory unit or can be directly generated and supplied from a global floorplanner procedure (e.g., process) 120 as shown in FIG. 6. The global floorplanner process 120, in one embodiment, is also implemented as program (e.g., instruction) code that is executed on computer system 112 (FIG. 1).

The global floorplanner process 120 of FIG. 6 receives information indicating the positions of the circuit blocks (e.g., 20a, 20b, 20c) within the integrated circuit design. Knowledgeable of the positions of the circuits blocks, the global floor planner process 120 of FIG. 6 determines a number of IOP placement constraints 130 that are pertinent to the placement of the IOPs along the periphery of the circuit blocks. Within IOP placement constraints 130, the global floor planner 120 generates an eligible placement domain for each IOP and optionally produces an arbitrary initial placement for the IOPs within their eligible edge domain, an IOP ordering constraint for the IOPs of each eligible edge domain and a maximum IOP density constraint allowed for each eligible edge domain. An exemplary data format of the IOP placement constraints 130 is described further below and illustrated in Table I.

With reference to FIG. 6, any of a number of well known global floorplanner processes 120 can be used consistent with the scope of the present invention. Among its other functions, the global floorplanner process 120 places the circuit blocks 20a–20c of the input integrated circuit layout 10 and is therefore aware of their locations with respect to each other.

The eligible edge domain for a given IOP indicates the possible edge locations (eligible edge placement domain) of a particular circuit block at which the IOP can be placed. Specifically, the eligible edge placement domain for each IOP indicates the possible locations along the edge, portion of an edge, or edges of a circuit block at which the IOP can be placed. The possible edge locations for a given IOP are determined based on the location of the circuit block or blocks with which the IOP communicates. For instance, if the particular IOP of a first circuit block is used to communicate with a second circuit block located to the right of the first circuit block, then the global floorplanner process 120 specifies that the particular IOP should be located on the right edge of the first circuit block. The right edge of the first circuit block is then the eligible edge placement domain for the particular IOP.

In addition to providing eligible edge domains for each IOP, the global floorplanner process 120 in one embodiment also specifies a particular edge location (e.g., initial edge placement) of the IOPs within their eligible edge domains. However, this initial placement is arbitrary and is not based on any particular preference. In other words, since internal circuitry of the circuit blocks (e.g., 20a, 20b, 20c) are not placed at the time the global floorplanner 120 is executed, any initial placement of the IOPs generated by the global floorplanner 120 is arbitrary. Although arbitrary, the above initial IOP placement can be viewed as an initial IOP placement constraint.

As described above, the global floor planner 120 can also provide other IOP constraints with respect to the placement of the IOPs within their individual eligible edge domains. One IOP constraint used is the ordering of IOPs within a particular eligible edge domain. A particular IOP ordering can be important to avoid signal wire routing problems (e.g., wires crossing, etc.). Another IOP constraint that can be supplied by the global floorplanner is the maximum pin density allowed for any eligible edge domain. This information is important to maintain predetermined area constraints pertinent to the integrated circuit design layout 10.

Table I below illustrates an exemplary format for the IOP constraint information stored in the IOP placement constraints 130 as supplied by the global floorplanner 120 and received by step 215 of the present invention process 200.

TABLE I

| IOP # | Eligible Edge Domain Definition | Arbitrary Placement | IOP Order | Max Density |
|---|---|---|---|---|
| IOP1 | Edge domain for IOP1 | (x, y) IOP1 | IOP1 Order | Density1 |
| IOP2 | Edge domain for IOP2 | (x, y) IOP2 | IOP1 Order | Density2 |
| IOP3 | Edge domain for IOP3 | (x, y) IOP3 | IOP1 Order | Density3 |
| IOPn | Edge domain for IOPn | (x, y) IOPn | IOP1 Order | Densityn |

Figure 7:
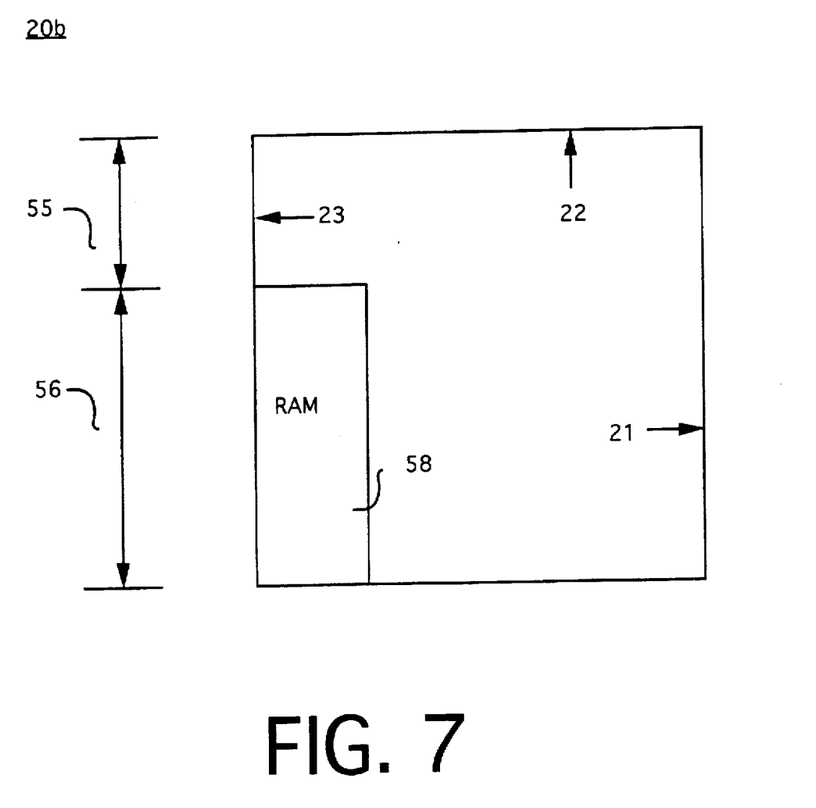
FIG. 7 is a block diagram illustration eligible input/output port assignments along edges or partial edges of a circuit block in accordance with the present invention.

Where: IOPn Order is the pin order for IOPn within its Edge domain Densityn is the maximum pin density allowed for the Edge domain for IOPn (x, y) IOPn is the arbitrary placement for IOPn within its Edge domain FIG. 7 illustrates that an eligible edge placement domain for a particular IOP can consist of: (1) a particular edge, e.g., edge 22; or (2) more than one edge, e.g., edges 21 and 22; or (3) only a portion of an edge, e.g., portion 22 of edge 23. For instance, if a particular IOP for circuit block 20b receives a global signal, e.g., a clock which is easily obtained from a number of different sources, the global floor planner 120 indicates that this IOP can be located on edges 22 or 21 (or perhaps all edges of the circuit block). In this case, the eligible edge placement domain for this IOP contains multiple edges, e.g., edges 22 and 21. In a second example, assume another IOP of circuit block 20b is to be coupled to a second circuit block located to the left of circuit block 20b. However, a RAM unit 58 is located on the left edge 23 and obstructs region 56 of left edge 23. This exemplary IOP cannot be located in region 56 of edge 23. Therefore, the eligible edge placement domain for this IOP is only region 55 of edge 23 which is an edge portion. In a third example, assume another IOP of circuit block 20b is to be coupled to a third circuit block located above circuit block 20b. In this case, the eligible edge placement domain for this IOP is edge 22. In each of the above examples, the global floor planner 120 indicates the appropriate eligible edge placement domain for the particular IOPs discussed above.

With reference to the present invention process 200 of FIG. 5A, at logic block 215, the IOP placement constraints 130 are received from the global floorplanner 120 and, as discussed above, indicate (1) the eligible edge domains for each IOP of the integrated circuit design and can also indicate: (2) an arbitrary IOP placement within each eligible edge domain; (3) an IOP ordering constraint for each eligible edge domain; and (4) a maximum IOP density constraint allowed for each eligible edge domain.

If not already performed by the global floorplanner process 120, also at block 215, the present invention determines an arbitrary initial placement of the IOPs with respect to their eligible edge domains. This initial IOP placement takes into consideration any other IOP constraints supplied by the global floorplanner 120 in the IOP placement constraints 130 (e.g., IOP ordering and maximum IOP density). At block 215, any arbitrary or random placement can be used by the present invention and, for each IOP, an actual location is determined within its eligible edge placement domain. In one embodiment, the IOP reference name is used as the basis for the arbitrary first placement and the IOPs are equally spaced apart within their eligible edge placement domain. In another embodiment of the present invention, a random or pseudo random procedure can be used to perform the arbitrary placement of IOPs at block 215.

At logic block 220 of FIG. 5A, the standard cells of each circuit block are placed by the present invention. It is appreciated that the placer procedure used in block 220 does not optimize the placements of the IOPs that it receives. Although the placement procedure 220 does not optimize placement of the IOPs, the positions of the IOPs have an effect on the placement of the standard cells within the internal circuitry of each circuit block. This is the case because the wire connection length between a given IOP and its connected cells is one of the lengths that is minimized according to the placing process 220.

In accordance with the present invention, a number of well known placement procedures can be used at block 220 including a number of different quadratic based placement procedures. One such placement system is called q_place and is supplied by Cadence of California as part of its Cell3 tools. Another placer that is suited for use within the present invention is described in U.S. Pat. No. 5,267,176 by Antreich et al., issued on Nov. 30, 1993 and incorporated herein. Another placement procedure that can be used in accordance with the present invention at step 220 is described in a reference entitled "GORDIAN: VLSI Placement by Quadratic Programming and Slicing Optimization," by J. M. Kleinhans, G. Sigl, F. M. Johannes, and K. J. Antreich, published in IEEE Transactions on Computer Aided Design, Volume 10, No. 3, Mar. 1991. Other well known placement procedures that can be used in accordance with the present invention are described in a reference entitled "A procedure for Placement of Standard-Cell VLSI Circuits," by A. E. Dunlop and B. W. Kernighan, published in IEEE Transactions on Computer Aided Design, Volume CAD-4, No. 1, Jan. 1985 and in another reference entitled "PROUD: A fast Sea-of-Gates Placement Algorithm" by R. S. Tsay, E. S. Kuh, and C. P. Hsu, published by the 25th ACM/IEEE Design Automation Conference (Paper 22.3, 1988 IEEE).

At the completion of block 220 of FIG. 5A, each standard cell within the internal circuitry of each circuit block is given an initial placement within each circuit block (e.g., 20a, 20b, 20c). This initial placement is stored in a memory unit (e.g., unit 102 or 104) of computer system 112.

Figure 8A:
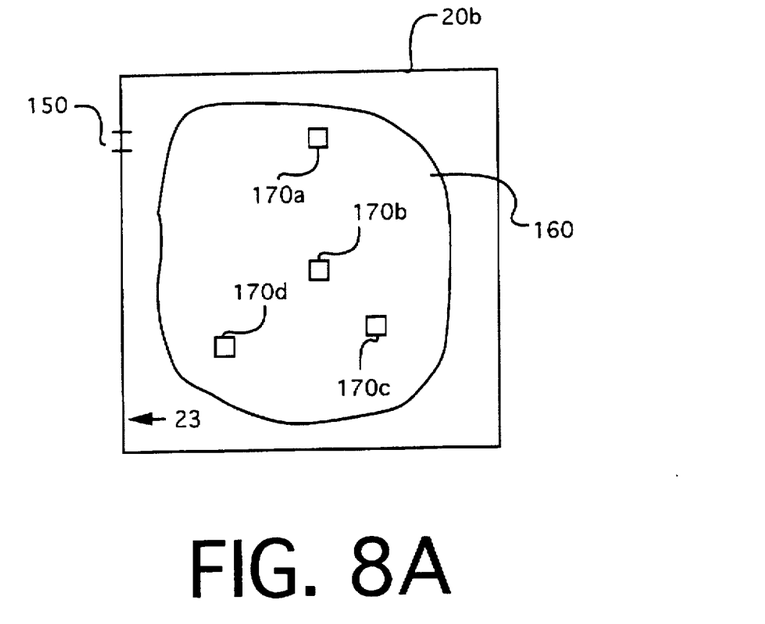
FIG. 8A illustrates an exemplary circuit block having a netlist that includes several cells that are coupled to an exemplary input/output port.

At logic block 230, the present invention displaces the positions of the IOPs of the integrated circuit design in order to optimize their positions according to a user-selected optimization rule. At block 230, in accordance with one user selected optimization rule, the positions of the IOPs are displaced to minimize wire length. Under the wire length minimization optimization, the present invention adjusts the locations of the IOPs to bring them closer to the cells to which they are connected to optimize their placement. At block 230, for each IOP of each circuit block, the present invention first determines the set of standard cells that are connected to the net that is connected to the IOP; this is performed only during the first pass of block 220 as multiple passes do not alter the composition of these nets. This cell association is stored in computer memory. FIG. 8A illustrates an example circuit block 20b with an exemplary IOP 150. As shown, there are four standard cells 170a–170d identified within the net coupled to IOP 150 within internal circuitry 160 of the circuit block 20b. The above cell identification is performed for each IOP of the integrated circuit design.

In accordance with wire length minimization optimization, once the set of standard cells is identified for each IOP of each circuit block, the present invention determines, for each IOP, which cell of the set of standard cells associated with an IOP is closest to the eligible edge placement domain for the IOP. Once this closet cell is identified, the present invention adjusts the position of the IOP, along the eligible edge placement domain, until the IOP is closest to this selected cell. This effectively moves the IOP along its eligible edge placement domain to a position closest to its nearest coupled cell. Upon the first iteration of block 230, the present invention insures that extra wiring metal is not used in the circuit blocks by optimizing the IOP placements.

Figure 8B:
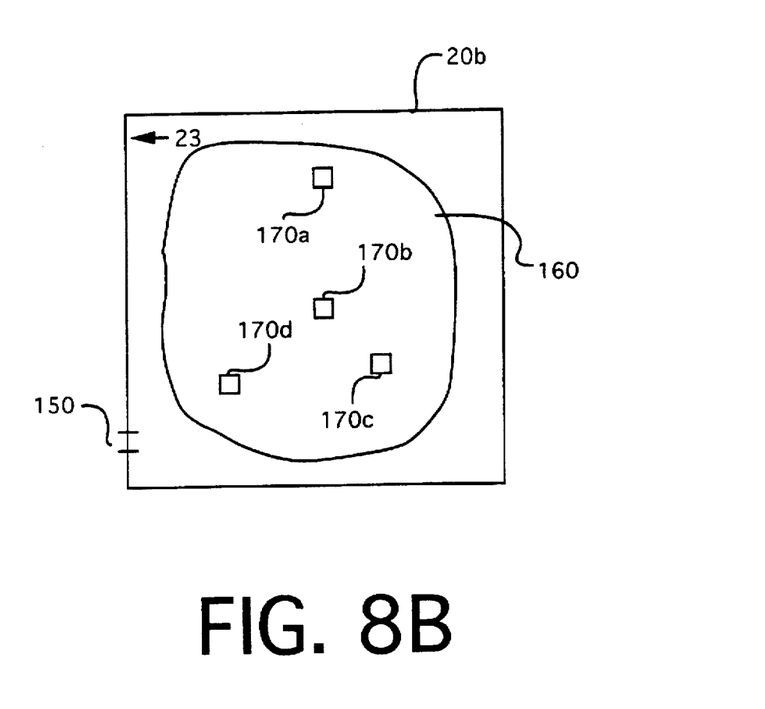
FIG. 8B illustrates an exemplary circuit block of FIG. 8A with the exemplary input/output block optimized in accordance with the present invention.

FIG. 8B illustrates an exemplary IOP displacement in accordance with step 230 for the user-selected wire length minimization optimization rule. Assume the eligible edge for IOP 150 is left edge 23. The cell closest to the left edge 23 is cell 170d. This cell is identified in block 230. The present invention moves the position of IOP 150 along edge 23 to a position nearest cell 170d as shown in FIG. 8B. The above IOP displacement is performed by the present invention for each IOP for each circuit block of the input integrated circuit design. At the completion of block 230, the present invention effectively places the IOPs closer to the standard cells to which they communicate. This reduces the wire interconnect lengths between the IOPs and their associated nets.

At block 230 of FIG. 5A, if two or more IOPs are placed at the same location along an edge of a particular circuit block, the present invention slightly displaces the overlapping IOPs until they no longer conflict.

Also at block 230, the user can select to perform IOP placement optimization in accordance with an optimization rule that optimizes for routability in conjunction with wire length minimization or instead of wire length minimization. In this case, the present invention is allowed to displace an IOP to a position (e.g., within its eligible edge domain) that does not minimize its associated wire length, but rather reduces wire congestion problem in identified areas. By reducing the wire conjunction, routability is improved.

It is appreciated that under any user-selected optimization rule for logic block 230, the present invention respects any IOP placement constraints 130 given by the global floorplanner process 120. At the completion of each iteration of block 230, the present invention records the IOP placement in computer memory within computer system 112.

At the completion of the IOP placement optimization 230 of FIG. 5A, logic block 235 of the present invention causes the computer system 1 12 to perform a routability estimate on the placement performed at block 220, as optimized by block 230, for the current iteration or cycle. It is appreciated that a number of well known routing estimator procedures can be employed within the present invention at block 235 of FIG. 5A to produce the routability estimate for the current cycle. The results of the routability estimate for each cycle are recorded in a memory unit of computer system 112 for subsequent reference.

In accordance with a preferred embodiment of the present invention, block 240 causes blocks 220, 230 and 235 to be executed for a predetermined number of cycles, n. According to wire length minimization optimization, upon each iteration of block 220, the standard cells within a particular circuit block gradually are placed (e.g., moved) to a location where the standard cell would naturally have been placed but for the random or arbitrary initial placement of the IOPs at block 215. The routability estimator 235 records its estimates of the routability for each cycle. The IOP placement optimization block 230 also records its IOP placement for each cycle. After n cycles have been executed, processing flows to block 245 of FIG. 5B.

At logic block 245 of FIG. 5B, the present invention process 200 causes computer system 112 to examine the results stored by the routability estimator 235 to determine which cycle of the n cycles produced the best routability estimate. At block 245, the IOP placement (as recorded by IOP placement optimization block 230) is selected having the best routability estimate over the n cycles. This selected IOP placement is forwarded to step 250.

At logic block 250, the present invention then performs a routing step of the IOP placement that is selected in block 245. At the completion of block 220, wire connections are routed between standard cells and IOPs and between circuit blocks and primary inputs and outputs. It is appreciated that a number of well known routing procedures can be employed within the present invention at block 250 of FIG. 5B. Once such router that can be employed at block 250 is called f_route and is supplied by Cadence of California.

At the completion of step 250, logic block 255 is executed wherein the present invention stores the placed and routed design of the integrated circuit design into a memory of the computer system 112.

ALTERNATIVE EMBODIMENT OF PROCESS 200

In accordance with an alternative embodiment of the present invention, circuit stabilization is utilized to determine the value of n as used by block 240 of FIG. 5A. Under this alternative embodiment, assuming a second iteration of block 220 and 230 has been performed, at logic block 240, the present invention determines if the standard cells of the input integrated circuit design were displaced in excess of a predetermined degree between the start and the end of block 220. The predetermined degree can be user determined. At block 240 of FIG. 5A, if the standard cells were displaced in excess of the predetermined degree, then the integrated circuit design is not yet stable and processing flows to logic block 220 of FIG. 5A where another placement is performed and another IOP displacement is performed at block 230. In typical practice, the integrated circuit can substantially stabilize after 4 or 5 iterations through logic block 220 and logic block 230. Upon each iteration of block 220, the standard cells within a particular circuit block gradually are placed (e.g., moved) to a location where the standard cell would naturally have been placed but for the random or arbitrary initial placement of the IOPs at block 215.

At block 240 of FIG. 5A, assuming a second iteration of block 220 and 230 has been performed, if the standard cells of the integrated circuit design were not displaced in excess of the predetermined degree, then the integrated circuit design is said to be stable and processing flows to logic block 250 of FIG. 5B. At logic block 250 of FIG. 5B, the present invention routes the stabilized design (see above) and at block 255 the present invention stores the resultant integrated circuit design in a memory unit (e.g., 102 or 104) of computer system 112. Processing then returns and exits placement procedure 200.

It is appreciated that another embodiment of the present invention is realized wherein block 220 and block 230 are executed a predetermined number of times (e.g., executed twice) without regard for the stability of the standard cells within the integrated circuit. After, block 250 of FIG. 5B is entered.

IOP OPTIMIZATION IN CONJUNCTION WITH A PLACER THAT DOES NOT PERFORM IOP OPTIMIZATION

By application of the post placement-processing step 230, where IOP are displaced along their eligible edge to the nearest cell to which they couple, the present invention provides a more effective standard cell placement procedure used in conjunction with a placer process that does not handle IOP optimization. Upon subsequent placement iterations, the standard cells are placed in positions that utilize less semiconductor area because wasted wire connect area is reduced due to IOP placement optimization. In practice, the present invention allows designs to be reduced from 10 to 30 percent in area over prior art designs that do not provide placement optimization of IOPs, depending on the number of IOPs versus other nets and the type of netlist.

The preferred embodiment of the present invention, an effective IOP placement procedure is described using an existing placer to generate a first standard cell placement and then moving the location of the IOPs within their allowable edge placements such that each IOP is moved to a position closest to the nearest cell coupled to the IOP, and then subsequently executing the placer again. While the present invention has been described in particular embodiments, it should be appreciated that the present invention should not be construed as limited by such embodiments, but rather construed according to the below claims.

What is claimed is:

1. A computer implemented method of placing cells within an integrated circuit design, said integrated circuit design having circuit blocks including cells and input/output ports, said method comprising the steps of:
   (a) receiving a set of input/output port placement constraints including eligible edge placement domains individually associated with said input/output ports;
   (b) determining an arbitrary initial placement for each input/output port within its associated eligible edge placement domain provided said arbitrary placement is absent from said input/output port placement constraints;
   (c) placing said cells of each circuit block using a placer procedure that does not optimize input/output port placement;
   (d) optimizing placements of said input/output ports in accordance with an optimization rule by adjusting placements of said input/output ports within their eligible edge placement domains;
   (e) performing a routability estimate of said integrated circuit design;
   (f) repeating steps (c)–(e) over n cycles; and
   (g) selecting a best routable optimized placement of said n cycles and routing said best routable optimized placement.

2. A method as described in claim 1 wherein said step (d) comprises the step of adjusting placements of each input/output port along its eligible edge placement domain to a placement position closest to a coupled cell that is nearest to said eligible edge placement domain of said each input/output port.

3. A method as described in claim 2 wherein said step of adjusting placements of each input/output port along its eligible edge placement domain comprises the steps of:
   identifying a set of cells within a net coupled to said input/output port;
   determining which cell of said set of cells is closest to said eligible edge placement domain of said input/output port, said cell being said coupled cell; and
   adjusting a placement of said input/output port to said placement position closest to said coupled cell.

4. A method as described in claim 2 wherein said step (d) comprises the further step of adjusting placement of each input/output port along its eligible edge placement domain to a position that reduces routing congestion within each circuit block.

5. A method as described in claim 1 wherein said placer procedure of step (c) is a quadratic based placement procedure minimizing wire connections between coupled cells of each circuit block and between input/output ports coupled to cells.

6. A method as described in claim 1 wherein said cells of said integrated circuit design are standard cells of variable width and uniform height.

7. A method as described in claim 1 wherein said set of eligible edge placement domains associated with said input/output ports are generated by a global floorplanner procedure.

8. A method as described in claim 1 wherein said input/output port placement constraints include input/output port ordering constraints.

9. In a computer system having a processor coupled to a bus and a memory coupled to said bus, a computer implemented method of placing cells within an integrated circuit design, said method comprising the steps of:

(a) receiving said integrated circuit design comprising circuit blocks having internal cells and edge located input/output ports;

(b) receiving input/output placement constraints including a set of eligible edge placement domains individually associated with said input/output ports;

(c) placing said cells of each circuit block using a placer procedure that does not optimize placement positions of said input/output ports;

(d) optimizing placements of said input/output ports to reduce wire length and reduce routing congestion by adjusting placements of said input/output ports within their eligible edge placement domains;

(e) performing a routability estimate of said integrated circuit design;

(f) repeating steps (c)–(e) for n cycles; and (g) selecting a best routable optimized placement of said n cycles and routing said best routable optimized placement using a routing procedure.

10. A method as described in claim 9 wherein said step (d) comprises the step of adjusting placements of each input/output port along its eligible edge placement domain to a placement position closest to a coupled cell that is nearest to said eligible edge placement domain of said each input/output port.

11. A method as described in claim 10 wherein said step of adjusting placements of each input/output port along its eligible edge placement domain comprises the steps of:

identifying a set of cells within a net coupled to said input/output port;

determining which cell of said set of cells is closest to said eligible edge placement domain of said input/output port, said cell being said coupled cell; and adjusting a placement of said input/output port to said placement position closest to said coupled cell.

12. A method as described in claim 9 wherein said placer procedure of step (c) is a quadratic based placement procedure minimizing wire connections between coupled cells of each circuit block and between input/output ports coupled to cells.

13. A method as described in claim 9 wherein said input/output placement constraints also include input/output port ordering constraints and input/output port maximum density constraints.

14. A method as described in claim 9 wherein said cells of said integrated circuit design are standard cells of variable width and uniform height.

15. A method as described in claim 9 wherein said input/output placement constraints also include an arbitrary initial placement of said input/output ports of said integrated circuit design, said arbitrary initial placement provided by a global floorplanner procedure.

16. A computer system having a processor coupled to a bus, a memory coupled to said bus, and logic, stored in said memory, for causing said computer system to place cells within an integrated circuit design, said logic comprising:

first program instructions receiving said integrated circuit design having circuit blocks which include cells and input/output ports;

second program instructions receiving input/output port constraints including a set of eligible edge placement domains individually associated with said input/output ports;

third program instructions obtaining an arbitrary initial placement for each input/output port within its associated eligible edge placement domain;

fourth program instructions placing said cells of each circuit block using a placer procedure that does not optimize placement of said input/output ports;

fifth program instructions optimizing placements of said input/output ports in accordance with an optimization rule by adjusting placements of said input/output ports within their eligible edge placement domains;

sixth program instructions performing a routability estimate of said integrated circuit design; and seventh program instructions for repeating said third, fourth and fifth program instructions for n cycles; and eight program instructions selecting a best routable placement design of said n cycles and routing said best routable placement design.

17. A computer system as described in claim 16 wherein said optimization rule optimizes input/output port placement to reduce wire length and to reduce routing congestion within each circuit block.

18. A computer system as described in claim 17 wherein said fifth program instructions comprises instructions for adjusting placements of each input/output port along its eligible edge placement domains to a placement position closest to a coupled cell that is nearest to said eligible edge placement domain of said each input/output port in order to reduce wire length.

19. A computer system as described in claim 17 wherein said fourth program instructions comprise a quadratic based placement procedure to reduce wire length within each circuit block.

20. A computer system as described in claim 16 further comprising global floorplanner program instructions and wherein said input/output port placement constraints are generated by said global floorplanner program instructions.

21. A computer system as described in claim 20 wherein said input/output port constraints further comprise an arbitrary initial input/output port placement, input/output port ordering constraints, and input/output maximum density constraints.

* * * * *